(12) United States Patent
Yang et al.

(10) Patent No.: US 10,672,649 B2
(45) Date of Patent: Jun. 2, 2020

(54) ADVANCED BEOL INTERCONNECT ARCHITECTURE

(71) Applicant: International Business Machines Corporation, Armonk, NY (US)

(72) Inventors: Chih-Chao Yang, Glenmont, NY (US); Theo Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/807,156

(22) Filed: Nov. 8, 2017

(65) Prior Publication Data

US 2019/0139820 A1    May 9, 2019

(51) Int. Cl.
| | |
|---|---|
| H01L 21/768 | (2006.01) |
| H01L 23/532 | (2006.01) |
| H01L 21/3213 | (2006.01) |
| C23C 18/54 | (2006.01) |
| H01L 21/321 | (2006.01) |
| H01L 21/28 | (2006.01) |
| C23C 18/16 | (2006.01) |

(Continued)

(52) U.S. Cl.
CPC .. *H01L 21/76807* (2013.01); *H01L 21/32137* (2013.01); *H01L 21/76843* (2013.01); *H01L 21/76871* (2013.01); *H01L 21/76874* (2013.01); *H01L 21/76879* (2013.01); *H01L 23/53223* (2013.01); *H01L 23/53238* (2013.01); *C23C 18/165* (2013.01); *C23C 18/38* (2013.01); *C23C 18/54* (2013.01); *C25D 7/123* (2013.01); *H01L 21/28123* (2013.01); *H01L 21/3212* (2013.01); *H01L 2221/1036* (2013.01)

(58) Field of Classification Search
CPC combination set(s) only.
See application file for complete search history.

(56) References Cited

U.S. PATENT DOCUMENTS

| | | |
|---|---|---|
| 6,599,828 B1 | 7/2003 | Gardner |
| 6,830,998 B1 | 12/2004 | Pan et al. |
| 6,861,350 B1 | 3/2005 | Ngo et al. |

(Continued)

OTHER PUBLICATIONS

Yang et al., "Low-Temperature Reflow Anneals of Cu on Ru", IEEE Electron Device Letters, Jun. 2011, pp. 806-808, vol. 32, No. 6.

(Continued)

*Primary Examiner* — Tony Tran
(74) *Attorney, Agent, or Firm* — Scully, Scott, Murphy & Presser, P.C.; Alvin Borromeo

(57) ABSTRACT

Advanced dual damascene interconnects have been provided in which a metallic seed liner composed of an electrically conductive metal or metal alloy having a first bulk resistivity is located on sidewall surfaces and a bottom wall of a first metallic structure that is present in a via portion of a combined via/line opening that is present in an interconnect dielectric material layer. The first metallic structure is composed of an electrically conductive metal or metal alloy that has a second bulk resistivity that is higher than the first bulk resistivity. In some embodiments, a second metal structure is present on a topmost surface of the first metallic structure. The second metallic structure is composed of an electrically conductive metal or metal alloy that differs from the electrically conductive metal or metal alloy of the first metallic structure.

3 Claims, 5 Drawing Sheets

(51) Int. Cl.
*C23C 18/38* (2006.01)
*C25D 7/12* (2006.01)

(56) References Cited

U.S. PATENT DOCUMENTS

| | | |
|---|---|---|
| 7,060,571 B1 | 6/2006 | Ngo et al. |
| 7,071,086 B2 | 7/2006 | Woo et al. |
| 7,091,118 B1 | 8/2006 | Pan et al. |
| 7,115,999 B2 | 10/2006 | Tsumura et al. |
| 7,138,323 B2 | 11/2006 | Kavalieros et al. |
| 7,217,611 B2 | 5/2007 | Kavalieros et al. |
| 7,271,045 B2 | 9/2007 | Prince et al. |
| 7,365,015 B2 | 4/2008 | Lin et al. |
| 7,422,936 B2 | 9/2008 | Barns et al. |
| 7,514,354 B2 | 4/2009 | Park et al. |
| 7,569,443 B2 | 8/2009 | Kavalieros et al. |
| 7,663,237 B2 | 2/2010 | Peng et al. |
| 7,667,278 B2 | 2/2010 | Cabral, Jr. et al. |
| 7,718,479 B2 | 5/2010 | Kavalieros et al. |
| 7,754,552 B2 | 7/2010 | Barns et al. |
| 8,492,274 B2 | 7/2013 | Yang et al. |
| 8,525,339 B2 | 9/2013 | Yang et al. |
| 8,575,028 B2 | 11/2013 | Reid et al. |
| 8,796,853 B2 | 8/2014 | Yang et al. |
| 9,312,203 B2 | 4/2016 | Li et al. |
| 9,362,377 B1 | 6/2016 | Kim et al. |
| 9,716,063 B1 | 7/2017 | Edelstein et al. |
| 9,741,577 B2 | 8/2017 | Li et al. |
| 9,793,156 B1 | 10/2017 | Yang |
| 2009/0169760 A1 | 7/2009 | Akolkar et al. |
| 2014/0220777 A1 | 8/2014 | Yang et al. |
| 2015/0093891 A1* | 4/2015 | Zope ................ H01L 21/76877 |
| | | 438/618 |
| 2015/0203961 A1 | 7/2015 | Ha et al. |
| 2016/0071791 A1 | 3/2016 | Huang et al. |
| 2016/0358815 A1 | 12/2016 | Yu et al. |
| 2017/0170062 A1 | 6/2017 | Murray et al. |

OTHER PUBLICATIONS

Yang et al., "Characterization of Cu Reflows on Ru", IEEE Electron Device Letters, Oct. 2011, pp. 1430-1432, vol. 32, No. 10.

Kokaze et al., "Performance of Integrated Cu Gap-Filling Process with Chemical Vapor Deposition Cobalt Liner", Jap. J. of Appl. Phys., May 2013, 52(5S3), pp. 05FA01-1 to 4.

List of IBM Patents or Patent Applications Treated as Related dated Nov. 8, 2017, 2 Pages.

Office Action dated May 1, 2019 received in U.S. Appl. No. 15/807,225, Copy Not Enclosed.

* cited by examiner

ADVANCED BEOL INTERCONNECT ARCHITECTURE

BACKGROUND

The present application relates to back-end-of-the-line (BEOL) semiconductor technology. More particularly, the present application relates to BEOL interconnect structures that have enhanced electromigration (EM) resistance and a controlled via resistance and methods of forming the same.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures.

Within typical dual damascene interconnect structures, electrically conductive metal vias run perpendicular to the semiconductor substrate and electrically conductive metal lines run parallel to the semiconductor substrate. Typically, the electrically conductive metal vias are present beneath the electrically conductive metal lines and both features are embedded within an interconnect dielectric material layer.

In conventional dual damascene interconnect structures, copper or a copper containing alloy has been used as the material of the electrically conductive metal vias and lines. In recent years, advanced dual damascene interconnect structures containing a combined electrically conductive via/line feature have been developed in which an alternative metal such as cobalt or ruthenium has been used instead of copper or a copper alloy in the electrically conductive via only, or in both the electrically conductive via and electrically conductive line. While the use of such alternative metals in the via can provide enhanced electromigration resistance, such advanced dual damascene structures exhibit a significant via resistance increase. In instances when the alternative metal replaces the copper or copper alloy line, reduced metal line resistance can be observed.

There is thus a need for providing advanced dual damascene interconnect structures in which an alternative metal can be used in at least the electrically conductive via without significant impact on the via resistance of the interconnect structure.

SUMMARY

One aspect of the present application relates to advanced dual damascene interconnect structures in which a metallic seed liner composed of an electrically conductive metal or metal alloy having a first bulk resistivity is located on sidewall surfaces and a bottom wall of a first metallic structure that is present in a via portion of a combined via/line opening that is present in an interconnect dielectric material layer. The first metallic structure is composed of an electrically conductive metal or metal alloy (i.e., an alternative metal such as mentioned above) that has a second bulk resistivity that is higher than the first bulk resistivity. In some embodiments, a second metal structure is present on a topmost surface of the first metallic structure. The second metallic structure is composed of an electrically conductive metal or metal alloy that differs from the electrically conductive metal or metal alloy of the first metallic structure.

The interconnect structures described herein have enhanced electromigration (EM) resistance and controlled via resistance.

In one embodiment, the semiconductor structure includes an interconnect level including an interconnect dielectric material layer having a combined via/line opening located therein. A diffusion barrier liner is located in at least the via portion of the combined via/line opening. A metallic seed liner composed of an electrically conductive metal or metal alloy having a first bulk resistivity is located within at least the via portion of the combined via/line opening and on at least the diffusion barrier liner. A first metallic structure composed of an electrically conductive metal or metal alloy having a second bulk resistivity higher than the first bulk resistivity is located in at least the via portion of the combined via/line opening. The metallic seed liner is located on sidewall surfaces and a bottom wall of the first metallic structure. The semiconductor structure of this embodiment further includes a second metallic structure composed of an electrically conductive metal or metal alloy that differs from the electrically conductive metal or metal alloy of the first metallic structure located in at least the line portion of the combined via/line opening. The second metallic structure is in direct contact with the first metallic structure.

In another embodiment of the present application, the semiconductor structure includes an interconnect level including an interconnect dielectric material layer having a combined via/line opening located therein. A diffusion barrier liner is located in at least the via portion of the combined via/line opening. A metallic seed liner composed of an electrically conductive metal or metal alloy having a first bulk resistivity is located within at least the via portion of the combined via/line opening and on at least the diffusion barrier liner. A metallic structure composed of an electrically conductive metal or metal alloy having a second bulk resistivity higher than the first bulk resistivity is located in both the via portion and the line portion of the combined via/line opening. The metallic seed liner is located on sidewall surfaces and a bottom wall of the metallic structure that is present in the via portion of the combined via/line opening.

Another aspect of the present application relates to a method of forming a semiconductor structure. In one embodiment, the method may include forming a combined via/line opening in an interconnect dielectric material layer. Next, a diffusion barrier material layer is formed in at least the via portion of the combined via/line opening. A metallic seed layer composed of an electrically conductive metal or metal alloy having a first bulk resistivity is then formed within at least the via portion of the combined via/line opening and on at least the diffusion barrier material layer. Next, a metallic structure composed of an electrically conductive metal or metal alloy having a second bulk resistivity higher than the first bulk resistivity is formed in at least the via portion of the combined via/line opening, wherein the metallic seed layer is located on the sidewall surfaces and a bottom wall of the metallic structure.

In some embodiments, the metallic structure is also present in the line portion of the combined via/line opening. In other embodiments, another metallic structure composed of an electrically conductive metal or metal alloy that differs from the electrically conductive metal or metal alloy of the metallic structure having the second bulk resistivity is formed in at least the via portion of the combined via/line opening.

DETAILED DESCRIPTION

Figure 1:
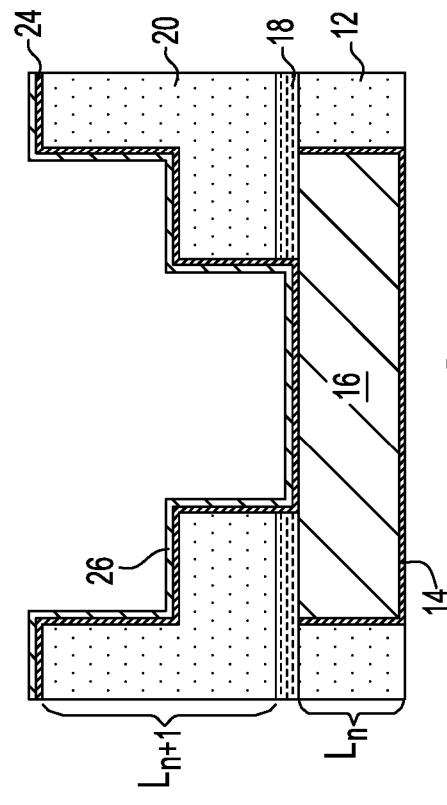
FIG. 1 is a cross sectional view of an exemplary semiconductor structure during an early stage of fabrication and including a second interconnect dielectric material layer having a combined via/line opening formed therein and located above a lower interconnect level in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Advanced interconnect structures are provided that exhibit enhanced electromigration (EM) resistance and a controlled via resistance. By "enhanced electromigration (EM) resistance", it is meant a resistance of greater than 20 mA/µm². By "controlled via resistance", it is meant a resistance of greater than 150 ohm/via. Notably, FIGS. 6-14 of the present application illustrate advanced interconnect structures of the present application that include an interconnect level, $L_{n+1}$, including an interconnect dielectric material layer 20 having a combined via/line opening 22 located therein. A diffusion barrier liner 24L is located in at least the via portion of the combined via/line opening 22. A metallic seed liner 26L composed of an electrically conductive metal or metal alloy having a first bulk resistivity is located within at least the via portion of the combined via/line opening 22 and on at least the diffusion barrier liner 24L. A first metallic structure 28 composed of an electrically conductive metal or metal alloy having a second bulk resistivity higher than the first bulk resistivity is located in at least the via portion of the combined via/line opening 22. The metallic seed liner 26L is located on the sidewall surfaces and a bottom wall of the first metallic structure 28. The semiconductor structure of this embodiment further includes a second metallic structure 30 composed of an electrically conductive metal or metal alloy that differs from the electrically conductive metal or metal alloy of the first metallic structure 28 located in at least the via portion of the combined via/line opening 22. The second metallic structure 30 is in direct contact with a topmost surface of the first metallic structure 28. Bulk resistivity (or volume resistivity) is a constant value for a certain material at a certain environment (typically measured at 20° C.). The bulk resistivity is a measure of the resistivity across a defined thickness of the material.

Figure 15:
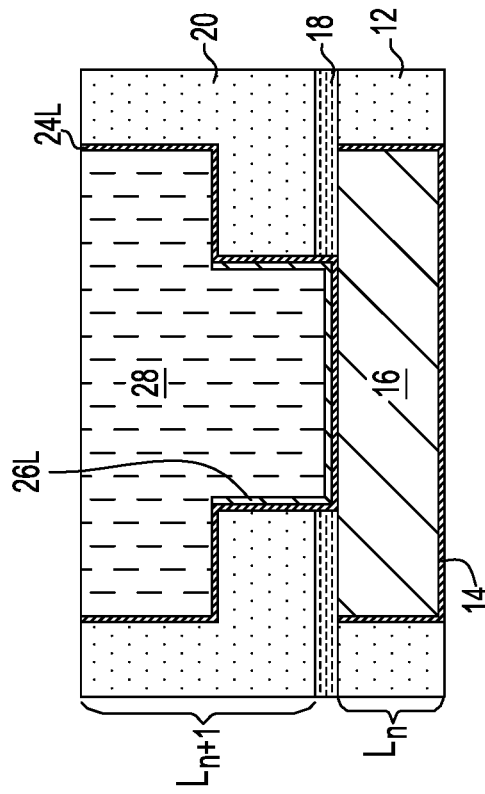
FIG. 15 is a cross sectional view of an exemplary semiconductor structure of the present application in accordance with an alternative embodiment of the present application.
Figure 16:
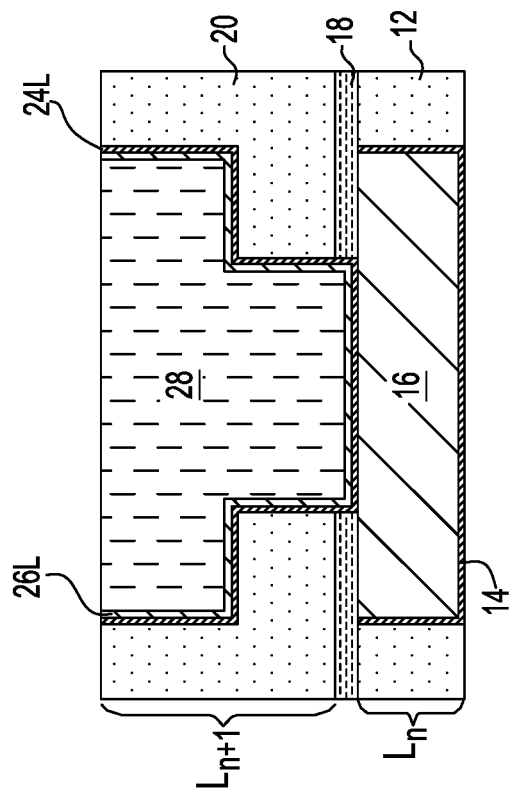
FIG. 16 is a cross sectional view of an exemplary semiconductor structure of the present application in accordance with an alternative embodiment of the present application.
Figure 17:
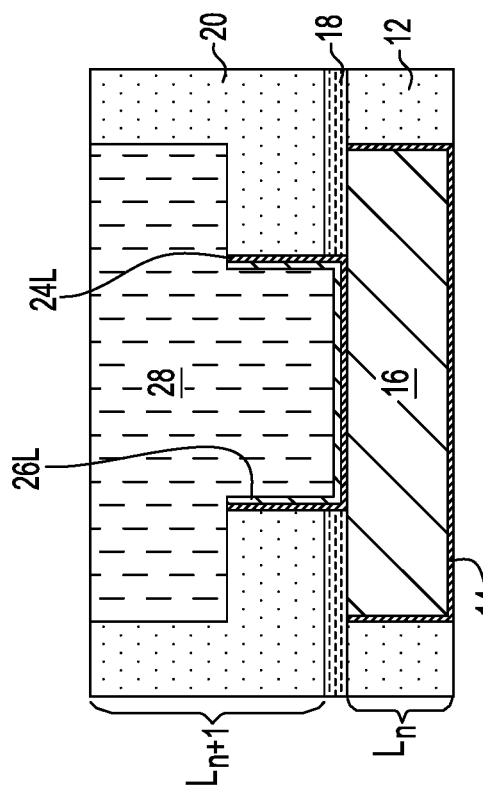
FIG. 17 is a cross sectional view of an exemplary semiconductor structure of the present application in accordance with an alternative embodiment of the present application.

FIGS. 15-17 illustrate other advanced interconnect structures of the present application that include an interconnect level, $L_{n+1}$, including an interconnect dielectric material layer 20 having a combined via/line opening 22 located therein. A diffusion barrier liner 24L is located in at least the via portion of the combined via/line opening 22. A metallic seed liner 26L composed of an electrically conductive metal or metal alloy having a first bulk resistivity is located within at least the via portion of the combined via/line opening 22 and on at least the diffusion barrier liner 24L. A metallic structure 28 composed of an electrically conductive metal or metal alloy having a second bulk resistivity higher than the first bulk resistivity is located in both the via portion and the line portion of the combined via/line opening 22. The metallic seed liner 26L of this embodiment is also located on the sidewall surfaces and a bottom wall of the first metallic structure 28 that is present in the via portion of the combined via/line opening 22.

Further details regarding the advanced interconnect structures described above are now provided.

Referring first to FIG. 1, there is illustrated an exemplary semiconductor structure during an early stage of fabrication in accordance with an embodiment of the present application. As is shown, the exemplary semiconductor structure of FIG. 1 includes a second interconnect dielectric material layer 20 having a combined via/line opening 22 formed therein and located above a lower interconnect level, $L_n$. The second interconnect dielectric material layer 20 is a component of an upper interconnect level, $L_{n+1}$, wherein n is 0 or an integer starting from 1. When n is 0, the lower interconnect level, $L_n$, is omitted and replaced with a semiconductor substrate that contains a plurality of semiconductor devices formed therein or thereupon.

In the illustrated embodiment, a capping layer 18 is positioned between the lower interconnect level, $L_n$, and the upper interconnect level, $L_{n+1}$. In some embodiments, capping layer 18 is omitted.

When present, the lower interconnect level, $L_n$, includes a first interconnect dielectric material layer 12 that includes at least one first metal-containing structure 16 embedded therein; the at least one first metal-containing structure is electrically conductive. A first diffusion barrier liner 14 is also present that surrounds the sidewalls and the bottom wall (i.e., bottommost surface) of the at least one first metal-containing structure 16 which is embedded in the first interconnect dielectric material layer 12. As is shown, the first metal-containing structure 16 and the first diffusion barrier liner 14 have topmost surfaces that are coplanar with each other as well as coplanar with a topmost surface of the first interconnect dielectric material layer 12. In some embodiments, the first diffusion barrier liner 14 may be omitted from the lower interconnect level, $L_n$. In some embodiments, the first interconnect dielectric material layer 12 may extend beneath the at least one first metal-containing structure 16 so as to completely embed the at least one first metal-containing structure 16.

The first interconnect dielectric material layer 12 of the lower interconnect level, $L_n$, may be composed of an inorganic dielectric material or an organic dielectric material. In some embodiments, first interconnect dielectric material layer 12 may be porous. In other embodiments, the first interconnect dielectric material layer 12 may be non-porous. Examples of suitable dielectric materials that may be employed as the first interconnect dielectric material layer 12 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first interconnect dielectric material layer 12 may have a dielectric constant (all dielectric constants mentioned herein are measured relative to a vacuum, unless otherwise stated) that is about 4.0 or less. In one embodiment, the first interconnect dielectric material layer 12 has a dielectric constant of 2.8 or less. These dielectrics generally having a lower parasitic cross talk as compared to dielectric materials whose dielectric constant is greater than 4.0.

The first interconnect dielectric material layer 12 may be formed by a deposition process such as, for example, chemical vapor deposition (CVD), plasma enhanced chemical vapor deposition (PECVD) or spin-on coating. The first interconnect dielectric material layer 12 may have a thickness from 50 nm to 250 nm. Other thicknesses that are lesser than 50 nm, and greater than 250 nm can also be employed in the present application.

After providing the first interconnect dielectric material layer 12, at least one opening (not shown) is formed into the first interconnect dielectric material layer 12; each opening will house a first metal-containing structure 16 and, if present, the first diffusion barrier liner 14. The at least one opening in the first interconnect dielectric material layer 12 may be a via opening, a line opening and/or combined a via/lines opening. The at least one opening may be formed by lithography and etching. In embodiments in which a combined via/line opening is formed, a second iteration of lithography and etching may be used to form such an opening.

In some embodiments, a first diffusion barrier material is then formed within the at least one opening and on an exposed topmost surface of the first interconnect dielectric material layer 12; the first diffusion barrier material will provide the first diffusion barrier liner 14 mentioned above. The first diffusion barrier material may include Ta, TaN, Ti, TiN, Ru, RuN, RuTa, RuTaN, W, WN or any other material that can serve as a barrier to prevent a conductive material from diffusing there through. The thickness of the first diffusion barrier material may vary depending on the deposition process used as well as the material employed. In some embodiments, the first diffusion barrier material may have a thickness from 2 nm to 50 nm; although other thicknesses for the diffusion barrier material are contemplated and can be employed in the present application as long as the first diffusion barrier material does not entirely fill the opening. The first diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the first diffusion barrier material. In cases in which the conductive material to be subsequently and directly formed on the first diffusion barrier material, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

Next, a first interconnect metal or metal alloy is formed into each opening and, if present, atop the first diffusion barrier material. The first interconnect metal or metal alloy provides the first metal-containing structure 16 of the present application. The first interconnect metal or metal alloy may be composed of copper (Cu), aluminum (Al), tungsten (W), or an alloy thereof such as, for example, a Cu—Al alloy. The first interconnect metal or metal alloy can be formed utilizing a deposition process such as, for example, CVD, PECVD, sputtering, chemical solution deposition or plating. In one embodiment, a bottom-up plating process is employed in forming the first interconnect metal or metal alloy. In some embodiments, the first interconnect metal or metal alloy is formed above the topmost surface of the first interconnect dielectric material layer 12.

Following the deposition of the first interconnect metal or metal alloy, a planarization process such as, for example, chemical mechanical polishing (CMP) and/or grinding, can be used to remove all interconnect metal or metal alloy (i.e., overburden material) that is present outside each of the openings forming the first metal-containing structure 16 shown in FIG. 1. The planarization stops on a topmost surface of the first interconnect dielectric material layer 12. Thus, and if present, the planarization process also removes the first diffusion barrier material from the topmost surface of the first interconnect dielectric material layer 12. The remaining portion of the first diffusion barrier material that is present in the at least one opening is referred to herein as the first diffusion barrier liner 14, while the remaining first interconnect metal or metal alloy that is present in the at least one opening may be referred to as the first metal-containing structure 16. Collectively, the first interconnect dielectric material layer 12, each optional first diffusion barrier liner 14, and each first metal-containing structure 16 define the lower interconnect level, $L_n$, of an interconnect structure of the present application.

Next, and in some embodiments, capping layer 18 can be formed on the physically exposed topmost surface of the lower interconnect level, $L_n$, of the present application. In some embodiments, capping layer 18 can be omitted. When present, the capping layer 18 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The capping material that provides the capping layer 18 may be formed utilizing a deposition process such as, for example, CVD, PECVD, ALD, chemical solution deposition or evaporation. When present, capping layer 18 may have a thickness from 10 nm to 100 nm. Other thicknesses that are lesser than 10 nm, or greater than 100 nm may also be used as the thickness of the capping layer 18.

Next, the second interconnect dielectric material layer 20 (without the combined via/line opening) is formed above the lower interconnect level, $L_n$. The second interconnect dielectric material layer 20 may include one of the interconnect dielectric materials mentioned above for the first interconnect dielectric material layer 12. In some embodiments, the second interconnect dielectric material layer 20 includes a same interconnect dielectric material as the first interconnect dielectric material layer 12. In other embodiments, the second interconnect dielectric material layer 20 includes a different interconnect dielectric material than the first interconnect dielectric layer 12. The second interconnect dielectric material layer 20 may be porous or non-porous, have a thickness within the thickness range of the first interconnect dielectric material layer 12, and be formed utilizing one of the deposition processes used in providing the first interconnect dielectric material layer 12.

Next, a combined via/line opening 22 (opening 22 can also be referred to herein as a dual damascene opening) can then be formed into the second interconnect dielectric material layer 20. During or, after, the formation of the via portion of the combined via opening 22, the capping layer 18 can be opened as is shown in FIG. 1 to expose a portion of the topmost surface of the at least one first metal-containing structure 16. In embodiments in which n is 0, the via portion of the combined via/line opening 22 can physically expose a conductive material or conductive region of one of the semiconductor devices that is formed upon or within a semiconductor substrate. The combined via/line opening 22 is formed utilizing a dual damascene process as known in the art. As is shown in FIG. 1, the line portion of the combined via/line opening 22 is located above the via portion of the combined via/line opening 22.

Figure 2:
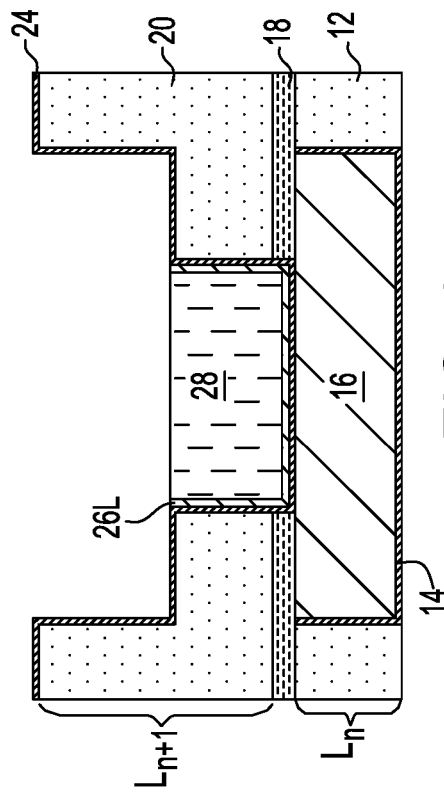
FIG. 2 is a cross sectional view of the exemplary semiconductor structure of FIG. 1 after forming a diffusion barrier material layer and a metallic seed layer in the combined via/line opening and on a topmost surface of the second interconnect dielectric material layer, wherein the metallic seed layer is composed of an electrically conductive metal or metal alloy having a first bulk resistivity.

Referring now to FIG. 2, there is illustrated the exemplary semiconductor structure of FIG. 1 after forming a diffusion barrier material layer 24 and a metallic seed layer 26 in the combined via/line opening 22 and on a topmost surface of the second interconnect dielectric material layer 20.

The diffusion barrier material layer 24 includes a second diffusion barrier material which may include one of the diffusion barrier materials mentioned above for the first diffusion barrier material. In one embodiment, the first and second diffusion barrier materials may be composed of a same diffusion barrier material. In another embodiment, the first and second diffusion barrier materials are composed of different diffusion barrier materials. The second diffusion barrier material that provides diffusion barrier material layer 24 may be formed utilizing one of the deposition processes mentioned above for forming the first diffusion barrier material, and the second diffusion barrier material that provides diffusion barrier material layer 24 may have a thickness within the thickness range mentioned above for the first diffusion barrier material.

Next, the metallic seed layer 26 is formed on the diffusion barrier material layer 24. The metallic seed layer 26 that is employed in the present application is composed of an electrically conductive metal or metal alloy having a first bulk resistivity. The first bulk resistivity is typically within a range from 1.5 µΩ·cm to 3.0 µΩ·cm, wherein µΩ equals microohms. The electrically conductive metal or metal alloy that provides the metallic seed layer 26 may include copper (Cu), aluminum (Al), or a copper-aluminum (Cu—Al) alloy in which the content of copper may be greater than, equal to, or less than the content of aluminum.

The thickness of the metallic seed layer 26 may vary depending on the material of the metallic seed layer 26 as well as the technique used in forming the same. Typically, the metallic seed layer 26 has a thickness from 1 nm to 80 nm. The metallic seed layer 26 can be formed by a conventional deposition process including, for example, CVD, PECVD, ALD, or PVD.

At this stage of the present application, the diffusion barrier material layer 24 and the metallic seed layer 26 are both continuously present in the combined via/line opening 22, and a portion of the bottommost surface of the diffusion barrier material layer 24 is formed directly upon the exposed topmost surface of the a first metal-containing structure 16 of the lower interconnect level, $L_n$. Also, the diffusion barrier material layer 24 and the metallic seed layer 26 have a combined thickness that does not entirely fill the combined via/line opening 22 that is present in the second interconnect dielectric material layer 20.

Figure 3:
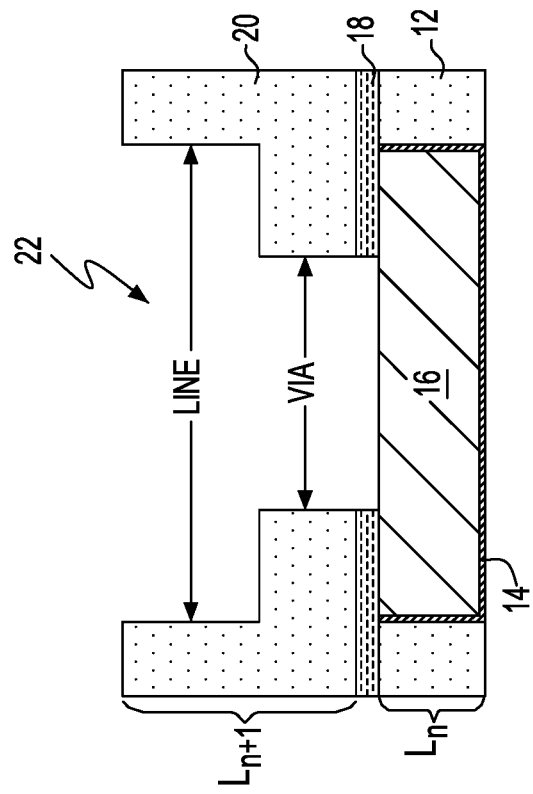
FIG. 3 is a cross sectional view of the exemplary semiconductor structure of FIG. 2 after forming a first metallic structure having a second bulk resistivity that is higher than the first bulk resistivity in at least the via portion of the combined via/line opening.

Referring now to FIG. 3, there is illustrated the exemplary semiconductor structure of FIG. 2 after forming a first metallic structure 28 having a second bulk resistivity that is higher than the first bulk resistivity in at least the via portion of the combined via/line opening 22. The second bulk resistivity is typically within a range from to 3.5 µΩ·cm to 8.0 µΩ·cm. In the embodiment illustrated in FIG. 3 as well as FIGS. 4-6, the first metallic structure completely fills in a remaining volume of the combined via/line opening 22 and is absent from the line portion of the combined via/line opening 22. See, also, the alternative exemplary semiconductor structures shown in FIGS. 7-8 of the present application.

In some embodiments of the present application (see, for example, the alternative exemplary structures of FIGS. 9, 10 and 11 of the present application), the first metallic structure 28 partially fills in a remaining volume of the combined via/line opening 22 and is absent from the line portion of the combined via/line opening 22. In such an embodiment, the topmost surface of the first metallic structure does not extend above the topmost surface of the via portion of the combined via/line opening 22.

In yet other embodiments of the present application (see, for example, the alternative exemplary structures of FIGS. 12, 13 and 14 of the present application), the first metallic structure 28 completely fills in a remaining volume of the combined via/line opening 22 and is partially present in the line portion of the combined via/line opening 22. In such an embodiment, the topmost surface of the first metallic structure 28 does not extend above the topmost surface of the line portion of the combined via/line opening 22.

In a still further embodiment of the present application (see, for example, the alternative exemplary structures of FIGS. 15, 16 and 17 of the present application), the first metallic structure 28 completely fills in a remaining volume of the combined via/line opening 22 and is completely present in the line portion of the combined via/line opening 22.

The first metallic structure 28 having the second bulk resistivity that is higher than the first bulk resistivity is composed of an electrically conductive metal or metal alloy that differs from the electrically conductive metal or metal alloy that provides the metallic seed layer 26.

The electrically conductive metal or metal alloy that provides the first metallic structure 28 can provide enhanced electromigration (EM) resistance to at least the via portion of the combined via/line opening 22. Examples of electrically conductive metals or metal alloys that can be used in providing the first metallic structure 28 include, but are not limited to, cobalt (Co), ruthenium (Ru), rhodium (Rh), iridium (Ir), tungsten (W), nickel (Ni) or alloys thereof.

In one embodiment of the present application, the first metallic structure 28 can be formed utilizing a plating process. Electroplating or electroless plating can both be employed. The plating process deposits the electrically conductive metal or metal alloy that provides the first metallic structure 28 in the bottom of the via portion upwards. The plating process can be stopped to provide a desired height of the first metallic structure 28.

In some embodiments, the first metallic structure 28 can be formed by first depositing a layer of the conductive metal or metal alloy that provides the first metallic structure 28 by CVD, ALD or PVD, and thereafter performing a reflow anneal. The reflow anneal may include a furnace anneal or a laser anneal; laser annealing is typically performed for a shorter period of time than furnace anneal. The reflow anneal is performed at a temperature that melts the conductive metal or metal alloy that provides the first metallic structure 28, but not the electrically conductive metal or metal alloy that provides the metallic seed layer 26.

In some embodiments, the first metallic structure 28 can be formed utilizing one of the above mentioned deposition processes and then performing a recess etching process. In some embodiments, it is possible to completely fill the combined via/line opening 22 with the electrically conductive metal or metal alloy that provides the first metallic structure 28 (without any recessing).

Figure 4:
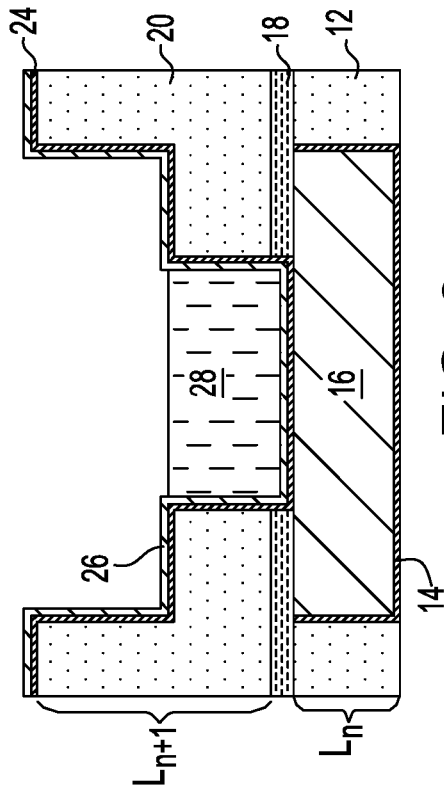
FIG. 4 is a cross sectional view of the exemplary semiconductor structure of FIG. 3 after optionally removing the metallic seed layer from the line portion of the combined via/line opening.

Referring now to FIG. 4, there is illustrated the exemplary semiconductor structure of FIG. 3 after optionally removing the metallic seed layer 26 from the line portion of the combined via/line opening 22. In some embodiments, this step of the present application can be omitted. The portion of the metallic seed layer 26 that remains in the combined via/line opening 22 is referred to herein as a metallic seed liner 26L. The metallic seed liner 26L may or may not have a topmost surface that is coplanar with a topmost surface of the first metallic structure 28. The metallic seed liner 26L is present at least within the via portion of the combined via/line opening 22 and it is present at least around sidewalls and the bottom wall, i.e., bottommost surface, of the first metallic structure 28 that is present in the via portion of the combined via/line opening 22.

In the embodiment illustrated in FIG. 4, the entirety of the metallic seed layer 26 is removed from the line portion of the combined via/line opening 22. In some embodiments, a portion of the metallic seed layer 26 may remain in the line portion of the combined via/line opening 22. In other embodiments, the entirety of the metallic seed layer 26 is removed from the line portion of the combined via/line opening 22 and a portion of the metallic seed layer 26 can be removed from the via portion of the combined via/line opening 22.

The removal of the metallic seed layer 26 from the combined via/line opening 22 may be performed utilizing a wet etch process in which a chemical etchant that is selective for removing the electrically conductive metal or metal alloy that provides the metallic seed layer 26 as compared to the electrically conductive metal or metal alloy that provides the first metallic structure 28 and the diffusion barrier material that provides the diffusion barrier material layer 24 is employed. For example, and when copper is used to provide the metallic seed layer 26, cobalt is used to provide the first metallic structure 28, and TaN is used to provide the diffusion barrier material layer 24, a mixture of metal hydroxides with other compounds can be used as the etchant. In some embodiment of the wet etch process, the first metallic structure 28 is employed as an etch mask, while the diffusion barrier material layer 24 is employed as an etch stop layer.

Figure 5:
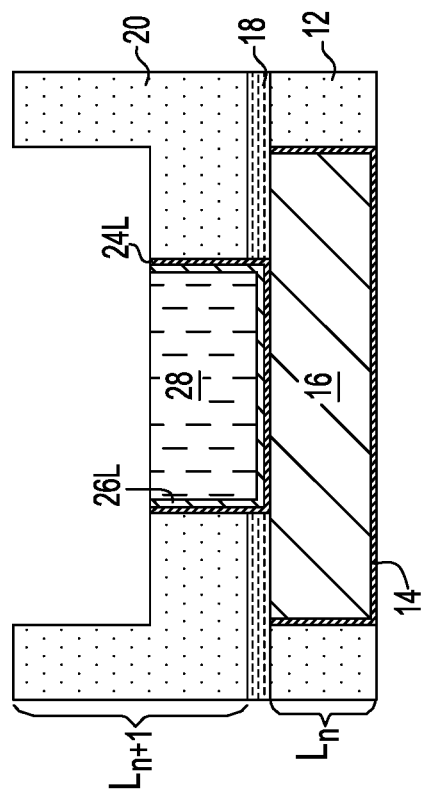
FIG. 5 is a cross sectional view of the exemplary semiconductor structure of FIG. 4 after optionally removing the diffusion barrier material layer from the line portion of the combined via/line opening.

Referring now to FIG. 5, there is illustrated the exemplary semiconductor structure of FIG. 4 after optionally removing the diffusion barrier material layer 24 from the line portion of the combined via/line opening 22. In some embodiments, this step of the present application may be omitted. The portion of the diffusion barrier material layer 24 that remains in the combined via/line opening 22 is referred to herein as a diffusion barrier liner 24L. The diffusion barrier liner 24L may or may not have a topmost surface that is coplanar with a topmost surface of the metallic seed liner 26L and/or the first metallic structure 28. The diffusion barrier liner 24L is present at least within the via portion of the combined via/line opening 22.

In the embodiment illustrated in FIG. 5, the entirety of the diffusion barrier material layer 24 is removed from the line portion of the combined via/line opening 22. In some embodiments, a portion of the diffusion barrier material layer 24 may remain in the line portion of the combined via/line opening 22. In other embodiments, the entirety of the diffusion barrier material layer 24 is removed from the line portion of the combined via/line opening 22 and a portion of the diffusion barrier material layer 24 can be removed from the via portion of the combined via/line opening 22.

The removal of the diffusion barrier material layer 24 from the combined via/line opening 22 may be performed utilizing a wet etch process in which a chemical etchant that is selective for removing the electrically diffusion barrier material that provides the diffusion barrier material layer 24 as compared to the electrically conductive metal or metal alloy that provides the first metallic structure 28 and the interconnect dielectric material that provides the second interconnect dielectric layer. For example, and when cobalt is used to provide the first metallic structure 28, and TaN is used to provide the diffusion barrier material layer 24, a mixture of compounds consisting of peroxy, azole, triazole and hydroxides can be used as the etchant. In some embodiments of the wet etch process, the first metallic structure 28 is employed as an etch mask.

Figure 6:
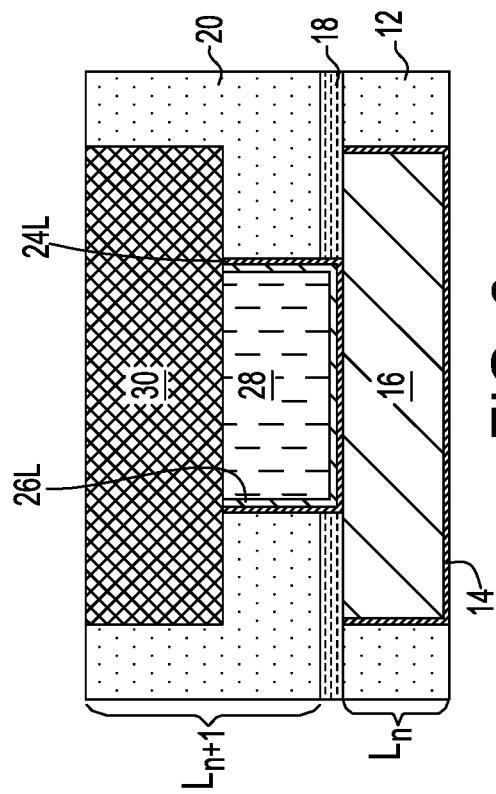
FIG. 6 is a cross sectional view of the exemplary semiconductor structure of FIG. 5 after forming a second metallic structure in the line portion of the combined via/line opening.

Referring now to FIG. 6, there is illustrated the exemplary semiconductor structure of FIG. 5 after forming a second metallic structure 30 in the line portion of the combined via/line opening 22. In this embodiment of the present application, the second metallic structure 30 is composed of a different electrically conductive metal or metal alloy than the first metallic structure 28. In some embodiments, the electrically conductive metal or metal alloy that provides the second metallic structure 30 can be composed of a same electrically conductive metal or metal alloy as the metallic seed layer 26. In such an embodiment, the electrically conductive metal or metal alloy that provides the second metallic structure 30 may be composed of Cu, Al, or a Cu—Al alloy. In some embodiments, the electrically conductive metal or metal alloy that provides the second metallic structure 30 can be composed of one of the electrically conductive metals or metal alloys that provides the first metallic structure 28 so long as the electrically conductive metal or metal alloy that provides the first and second metallic structures 28, 30 are compositionally different from each other. For example, Co can be used as the first metallic structure 28, while Ru or Rh can be used as the second metallic structure 30.

In some embodiments, this step is omitted and the line opening is formed with a same electrically conductive metal or metal alloy as the first metallic structure 28. Such structures are illustrated in FIGS. 15-17. In the illustrated embodiment of FIG. 6, the second metallic structure 30 is present only in the line portion of the combined via/line opening 22; the second metallic structure 30 in such an embodiment may completely fill or partially fill the line portion of combined via/line opening 22. In such embodiments in which the second metallic structure 30 partially fills the line portion of combined via/line opening 22, the second metallic structure 30 is located in an upper portion of the line portion of the combined via/line opening (see, for example, the alternative exemplary structures shown in FIGS. 12, 13 and 14). In some embodiments (see, for example, the alternative exemplary structures shown in FIGS. 9, 10, 11), a portion of the second metallic structure 30 can be present in an upper portion of the via portion of the combined via/line opening 22.

The second metallic structure 30 has a bottommost surface that directly contacts a topmost surface of the first metallic structure 28 and a topmost surface that is coplanar with a topmost surface of the second interconnect dielectric material. Collectively, and in some embodiments, the first metallic structure 28 and the second metallic structure 30 provide a metal-containing structure that is embedded in the second interconnect dielectric material layer 20. In other embodiments, the first metallic structure 28 alone provides a metal-containing structure that is embedded in the second interconnect dielectric material layer 20.

The second metallic structure 30 may be formed be a deposition process such as, for example, CVD, PECVD, PVD, or plating. A reflow anneal and/or a planarization process may or may not be employed following the deposition process.

FIG. 6 represents one exemplary semiconductor structure of the present application. In this embodiment, the exemplary semiconductor structure includes a lower interconnect level, $L_n$, that has at least one first metal-containing structure 16 embedded in a first interconnect dielectric material layer 12. An upper interconnect level, $L_{n+1}$, is present above the lower interconnect level, $L_n$. The upper interconnect level, $L_{n+1}$, includes a first metallic structure 28 and a second metallic structure 30 that are embedded in a second interconnect dielectric material layer 20. In this embodiment, the first metallic structure 28 is present only in the via portion of the combined via/line opening 22, while the second metallic structure 30 is located only within the line portion of the combined via/line opening 22. The exemplary semiconductor structure of this embodiment of the present application further includes the diffusion barrier liner 24L and the metallic seed liner 26L present only in the via portion of the combined via/line opening 22; in this embodiment, the diffusion barrier liner 24L, the metallic seed liner 26L and the first metallic structure 28 occupy an entirety of the via portion of the combined via/line opening 22. As is shown, the metallic seed liner 26L is present on the entirety of the sidewalls of the first metallic structure 28 and along the entirety of the bottommost surface of the first metallic structure 28. In this embodiment, the first metallic structure 28 has a topmost surface that is coplanar with topmost surfaces of the metallic seed liner 26L and the diffusion barrier liner 24L. In this embodiment, the metallic seed liner 26L and the diffusion barrier liner 24L are both U-shaped. The term "U-shaped" denotes a material having a horizontal portion and a vertical portion that extends upward from both ends of the horizontal portion. In this embodiment, the second metallic structure 30 occupies the entirety of the line portion of the combined via/line opening 22 and has sidewall surfaces that directly contact portions of the second interconnect dielectric material layer 20.

Figure 7:
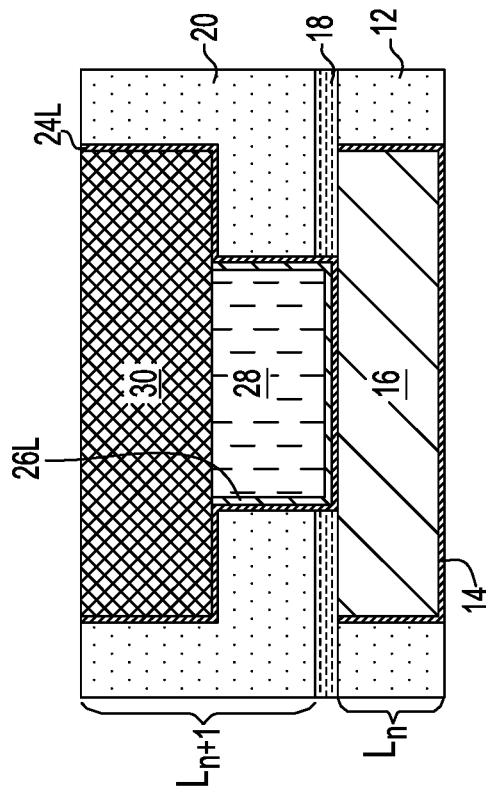
FIG. 7 is a cross sectional view of an exemplary semiconductor structure of the present application in accordance with an alternative embodiment of the present application.

Referring now to FIG. 7, there is illustrated an exemplary semiconductor structure of the present application in accordance with an alternative embodiment of the present application. The exemplary semiconductor structure shown in FIG. 7 is similar to the one shown in FIG. 6 except that the diffusion barrier material layer 24 and the metallic seed layer 26 are not removed from the line portion of the combined via/line opening 22. Instead, the diffusion barrier liner 24L and the metallic seed liner 26L are present in both the via and line portions of the combined via/line opening 22. In this embodiment, the exemplary structure shown in FIG. 3 is first formed, and thereafter the second metallic structure 30 is formed in the line portion of the combined via/line opening 22. The portions of the diffusion barrier material layer 24 and the metallic seed layer 26 that are located on the topmost surface of the second interconnect dielectric material layer 20 are removed after, or during, the formation of the second metallic structure 30. In this exemplary semiconductor structure of the present application, topmost surfaces of the second metallic structure 30, the metallic seed liner 26L, the diffusion barrier liner 24L, and the second interconnect dielectric material layer 20 are coplanar with each other. In this embodiment, a portion of the diffusion barrier liner 24L, a portion of the metallic seed liner 26L and the first metallic structure 28 occupy an entirety of the via portion of the combined via/line opening 22, while another portion of the diffusion barrier liner 24L, another portion of the metallic seed liner 26L and the second metallic structure 30 occupy an entirety of the line portion of the combined via/line opening 22.

Figure 8:
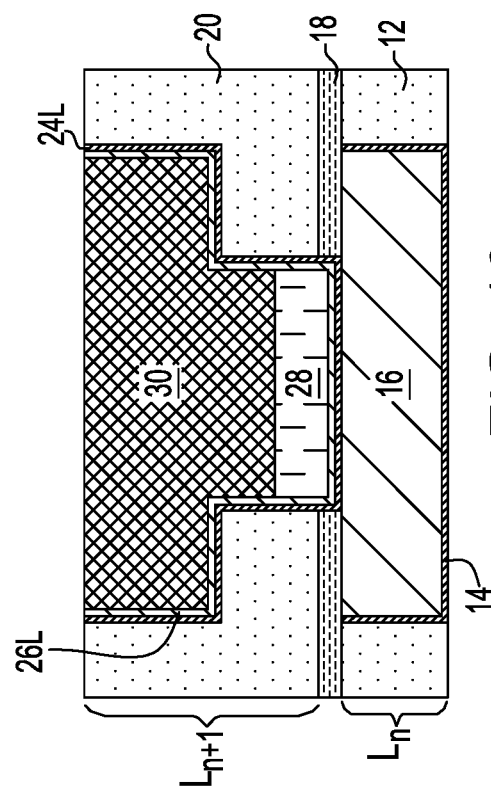
FIG. 8 is a cross sectional view of an exemplary semiconductor structure of the present application in accordance with an alternative embodiment of the present application.

Referring now to FIG. 8, there is illustrated an exemplary semiconductor structure of the present application in accordance with an alternative embodiment of the present application. The exemplary semiconductor structure shown in FIG. 8 is similar to the one shown in FIG. 6 except that the diffusion barrier material layer 24 is not removed from the line portion of the combined via/line opening 22. Thus, the diffusion barrier liner 24L is present in both the via and line portions of the combined via/line opening 22, while the metallic seed liner 26L is only present in the via portion of the combined via/line opening 22. In this embodiment, the exemplary structure shown in FIG. 4 is first formed, and thereafter the second metallic structure 30 is formed in the line portion of the combined via/line opening 22. The portions of the diffusion barrier material layer 24 that are located on the topmost surface of the second interconnect dielectric material layer 20 are removed after or during the formation of the second metallic structure. In this exemplary semiconductor structure of the present application, topmost surfaces of the second metallic structure 30, the diffusion barrier liner 24L, and the second interconnect dielectric material layer 20 are coplanar with each other. In this embodiment, a portion of the diffusion barrier liner 24L, the metallic seed liner 26L and the first metallic structure 28 occupy an entirety of the via portion of the combined via/line opening 22, while another portion of the diffusion barrier liner 24L, and the second metallic structure 30 occupy an entirety of the line portion of the combined via/line opening 22.

Figure 9:
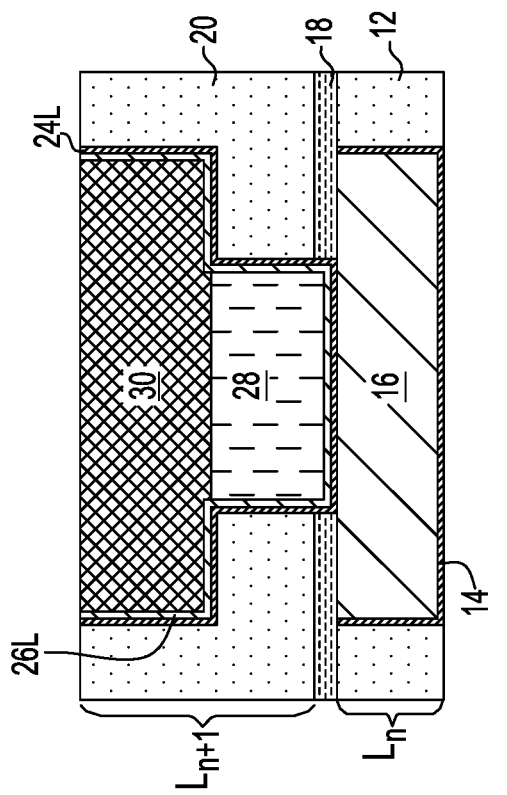
FIG. 9 is a cross sectional view of an exemplary semiconductor structure of the present application in accordance with an alternative embodiment of the present application.

Referring now to FIG. 9, there is illustrated an exemplary semiconductor structure of the present application in accordance with an alternative embodiment of the present application. The exemplary semiconductor structure shown in FIG. 9 is similar to the one shown in FIG. 8 except the first metallic structure 28 is partially present in the via portion of the combined via/line opening 22, and that the second metallic structure 30 is present in an upper portion of the via portion of the combined via/line opening 22 as well as the line portion of the combined via/line opening 22. In this embodiment, the metallic seed liner 26L has topmost surfaces that are coplanar with a topmost surface of the first metallic structure, while the diffusion barrier liner has topmost surfaces that are coplanar with a topmost surface of the second metallic structure 30, and the topmost surface of the second interconnect dielectric material 20. The exemplary structure shown in FIG. 9 can be derived from the process description mentioned above for providing the structures shown in FIGS. 1-6 of the present application. In this embodiment, a portion of the diffusion barrier liner 24L, the metallic seed liner 26L and the first metallic structure 28 occupy a lower portion of the via portion of the combined via/line opening 22, and another portion of the diffusion barrier liner 24L and the second metallic structure 30 occupy an upper portion of the via portion of the combined via/line opening 22 and an entirety of the line portion of the combined via/line opening 22.

Figure 10:
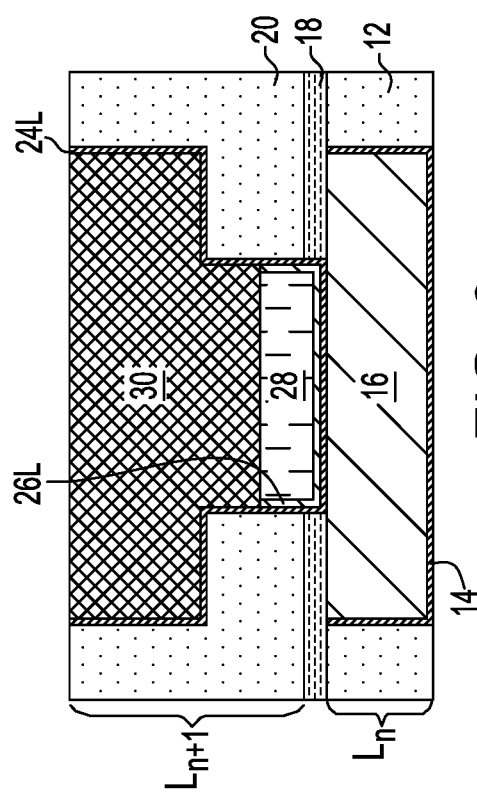
FIG. 10 is a cross sectional view of an exemplary semiconductor structure of the present application in accordance with an alternative embodiment of the present application.

Referring now to FIG. 10, there is illustrated an exemplary semiconductor structure of the present application in accordance with an alternative embodiment of the present application. The exemplary semiconductor structure shown in FIG. 10 is similar to the one shown in FIG. 7 except that the first metallic structure 28 is partially present in the via portion of the combined via/line opening 22, and that the second metallic structure 30 is present in an upper portion of the via portion of the combined via/line opening 22 as well as the line portion of the combined via/line opening 22. In this exemplary semiconductor structure of the present application, topmost surfaces of the second metallic structure 30, the diffusion barrier liner 24L, and the second interconnect dielectric material layer 20 are coplanar with each other. The exemplary structure shown in FIG. 10 can be derived from the process description mentioned above for providing the structures shown in FIGS. 1-6 of the present application. In this embodiment, a portion of the diffusion barrier liner 24L, a portion of the metallic seed liner 26L and the first metallic structure 28 occupy a lower portion of the via portion of the combined via/line opening, and another portion of the diffusion barrier liner 24L, another portion of the metallic seed liner 26L and the second metallic structure 30 occupy an upper portion of the via portion of the combined via/line opening 22 and an entirety of the line portion of the combined via/line opening 22.

Figure 11:
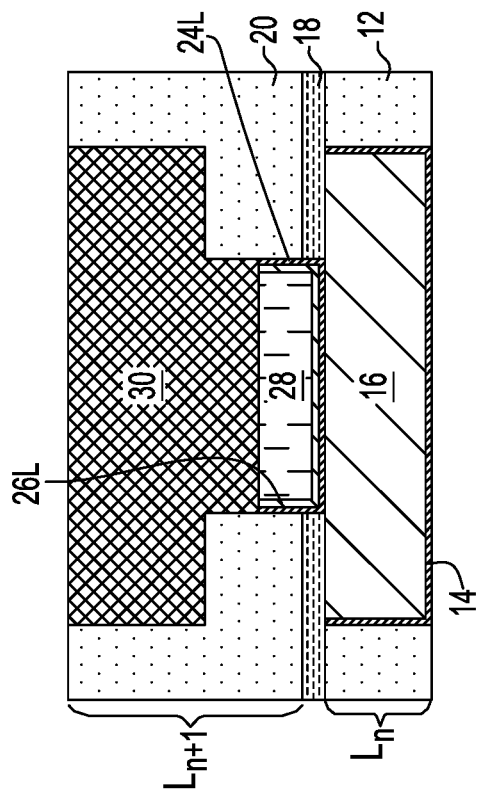
FIG. 11 is a cross sectional view of an exemplary semiconductor structure of the present application in accordance with an alternative embodiment of the present application.

Referring now to FIG. 11, there is illustrated an exemplary semiconductor structure of the present application in accordance with an alternative embodiment of the present application. The exemplary semiconductor structure shown in FIG. 11 is similar to the one shown in FIG. 9 except that the diffusion barrier material layer (and thus the diffusion barrier liner 24L) has been removed completely from the line portion of the combined via/line opening 22 as well as an upper portion of the via portion of the combined via/line opening 22. In this exemplary semiconductor structure of the present application, topmost surfaces of the first metallic structure 28, the diffusion barrier liner 24L, and metallic seed layer 26L are coplanar with each, while topmost surfaces of the second metallic structure 30 and the second interconnect dielectric material layer 20 are coplanar with each other. The exemplary structure shown in FIG. 11 can be derived from the process description mentioned above for providing the structures shown in FIGS. 1-6 of the present application. In the embodiment, the diffusion barrier liner 24L, the metallic seed liner 26L and the first metallic 28 structure occupy a lower portion of the via portion of the combined via/line opening 22, and the second metallic structure 30 occupies an upper portion of the via portion of the combined via/line opening 22 and an entirety of the line portion of the combined via/line opening 22.

Figure 12:
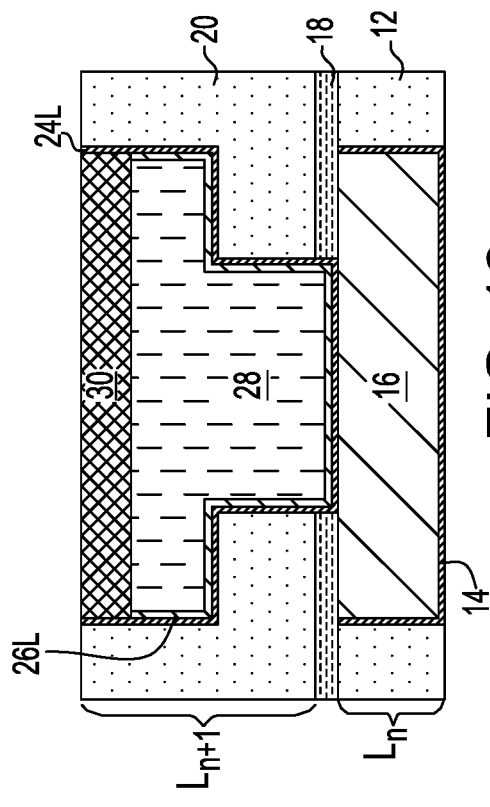
FIG. 12 is a cross sectional view of an exemplary semiconductor structure of the present application in accordance with an alternative embodiment of the present application.
Figure 13:
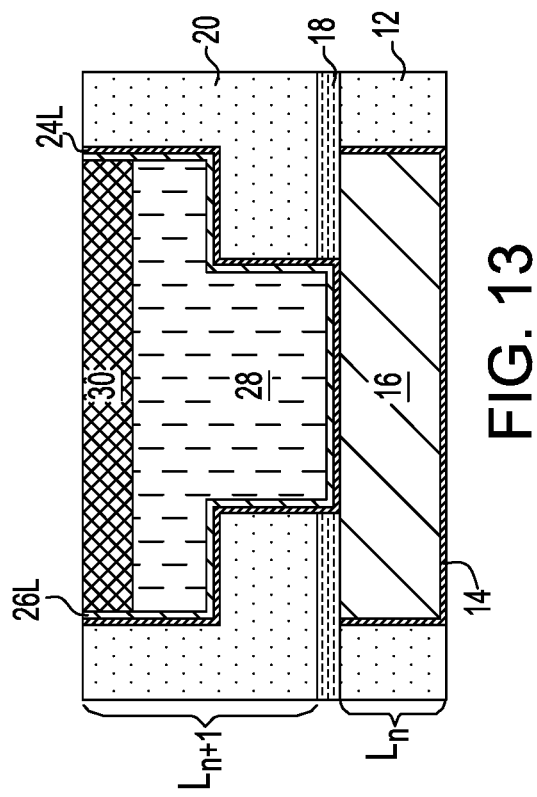
FIG. 13 is a cross sectional view of an exemplary semiconductor structure of the present application in accordance with an alternative embodiment of the present application.
Figure 14:
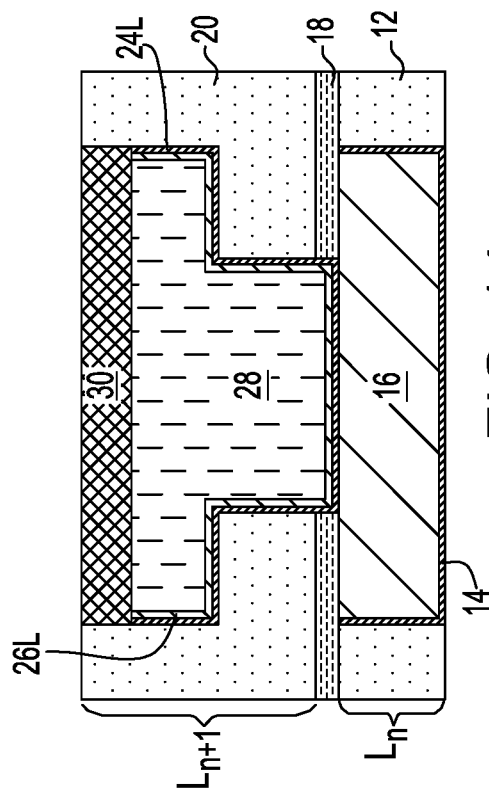
FIG. 14 is a cross sectional view of an exemplary semiconductor structure of the present application in accordance with an alternative embodiment of the present application.

Referring now to FIGS. 12-14, there are illustrated exemplary semiconductor structures of the present application in accordance with alternative embodiments of the present application. The exemplary structure shown in FIGS. 12-14 can be derived from the process description mentioned above for providing the structures shown in FIGS. 1-6 of the present application. In FIGS. 12-14, a portion of the first metallic structure 28 extends into the line portion of the combined via/line opening 22.

In FIG. 12, the metallic seed liner 26L and the diffusion barrier liner 24L are present in both the via portion and the line portion of the combined via/line opening 22. Moreover, and in FIG. 12, the metallic seed layer 26L has topmost surfaces that are coplanar with a topmost surface of the first metallic structure 28 which extends into the line portion of the combined via/line opening 22. Also, in FIG. 12, the diffusion barrier liner 24L has topmost surfaces that are coplanar with a topmost surface of both the second metallic structure 30 and the second interconnect dielectric material layer 20.

In FIG. 13, the metallic seed liner 26L and the diffusion barrier liner 24L are present in both the via portion and the line portion of the combined via/line opening 22. Moreover, and in FIG. 13, topmost surfaces of the second metallic structure 30, the diffusion barrier liner 24L, the metallic seed liner 26L and the second interconnect dielectric material layer 20 are coplanar with each other.

In FIG. 14, the metallic seed liner 26L and the diffusion barrier liner 14L are present in both the via portion and the line portion of the combined via/line opening 22. Moreover, the topmost surfaces of the first structure 28, the diffusion barrier liner 24L, and the metallic seed layer 16L are coplanar with each other, while the topmost surface of the second metallic structure is coplanar with a topmost surface of the second interconnect dielectric material layer 20.

Referring now to FIGS. 15-17, there are illustrated exemplary semiconductor structures of the present application in accordance with alternative embodiments of the present application. The exemplary structure shown in FIGS. 15-17 can be derived from the process description mentioned above for providing the structures shown in FIGS. 1-6 of the present application. In FIGS. 15-17, the second metal structure 30 has been omitted and an upper portion of the first metallic structure 28 is formed instead. In FIG. 15, the diffusion barrier liner 24L and the metallic seed layer 26L are present in both the via portion and the line portion of the combined via/line opening 22. Also, in FIG. 15, the topmost surfaces of the first metallic structure 28, the diffusion barrier liner 24L, the metallic seed liner 26L and the second interconnect dielectric material layer 20 are coplanar with each other. In FIGS. 16-17, the metallic seed liner is present only in the via portion of the combined via/line opening 22. In FIG. 16, the diffusion barrier liner 24L is present in both the via portion and the line portion of the combined via/line opening 22, while in FIG. 17 the diffusion barrier liner 24L is present in only the via portion of the combined via/line opening 22.

It is noted that the various exemplary semiconductor structures of the present application, as shown, for example, in FIGS. 6-17, include an advanced dual damascene interconnect structure, i.e., the upper interconnect level, $L_{n+1}$, in which an alternative metal (i.e., the first metallic structure 28) can be used in the electrically conductive via without increasing the via resistance of the interconnect structure. Enhanced EM is also observed for the advanced dual damascene interconnect structures of the present application. In some embodiments, high line resistance may also be observed for the advanced dual damascene interconnect structures.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
an interconnect level comprising an interconnect dielectric material layer having a combined via/line opening located therein, wherein a via portion of the combined via/line opening is located directly beneath a line portion of the combined via/line opening;
a diffusion barrier liner located in the via portion, but not the line portion, of the combined via/line opening;
a metallic seed liner composed of an electrically conductive metal or metal alloy having a first bulk resistivity and located in the via portion, but not the line portion, of the combined via/line opening and directly contacting the diffusion barrier liner, wherein the electrically conductive metal or metal alloy that provides the metallic seed liner is selected from the group consisting of copper (Cu), aluminum (Al), and a copper-aluminum (Cu—Al) alloy;
a first metallic structure composed of an electrically conductive metal or metal alloy having a second bulk resistivity higher than the first bulk resistivity and located in the via portion, but not the line portion, of the combined via/line opening, wherein the metallic seed liner is located directly on sidewall surfaces and a bottom wall of the first metallic structure and the diffusion barrier liner, the metallic seed liner, and the first metallic structure have a topmost surface that is coplanar with each other, and wherein the electrically conductive metal or metal alloy that provides the first metallic structure is selected from the group consisting of cobalt (Co), ruthenium (Ru), rhodium (Rh), iridium (Ir), nickel (Ni) and alloys thereof;
a second metallic structure composed of an electrically conductive metal or metal alloy that differs from the electrically conductive metal or metal alloy of the first metallic structure and located in at least the line portion of the combined via/line opening, wherein the second metallic structure directly contacts the interconnect dielectric material and is present entirely above, and in direct physical contact with, the first metallic structure, and wherein the electrically conductive metal or metal alloy that provides the second metallic structure is selected from the group consisting of copper (Cu), aluminum (Al), and a copper-aluminum (Cu—Al) alloy; and
wherein the diffusion barrier liner, the metallic seed liner and the first metallic structure occupy a lower portion of the via portion of the combined via/line opening, and wherein the second metallic structure occupies an upper portion of the via portion of the combined via/line opening and an entirety of the line portion of the combined via/line opening.

2. A semiconductor structure comprising:
an interconnect level comprising an interconnect dielectric material layer having a combined via/line opening located therein, wherein a via portion of the combined via/line opening is located directly beneath a line portion of the combined via/line opening;

a diffusion barrier liner located in both the via portion and the line portion of the combined via/line opening;

a metallic seed liner composed of an electrically conductive metal or metal alloy having a first bulk resistivity and located in the via portion, but not the line portion, of the combined via/line opening and directly contacting the diffusion barrier liner present in the via portion of the combined via/line opening, wherein the electrically conductive metal or metal alloy that provides the metallic seed liner is selected from the group consisting of copper (Cu), aluminum (Al), and a copper-aluminum (Cu—Al) alloy;

a first metallic structure composed of an electrically conductive metal or metal alloy having a second bulk resistivity higher than the first bulk resistivity and located in the via portion, but not the line portion, of the combined via/line opening, wherein the metallic seed liner is located directly on sidewall surfaces and a bottom wall of the first metallic structure, and wherein the electrically conductive metal or metal alloy that provides the first metallic structure is selected from the group consisting of cobalt (Co), ruthenium (Ru), rhodium (Rh), iridium (Ir), nickel (Ni) and alloys thereof, wherein a topmost surface of the metallic seed layer is coplanar with a topmost surface of the first metallic structure;

a second metallic structure composed of an electrically conductive metal or metal alloy that differs from the electrically conductive metal or metal alloy of the first metallic structure and located in at least the line portion of the combined via/line opening, wherein the second metallic structure directly contacts the diffusion barrier liner and is entirely above, and in direct physical contact with, the first metallic structure, and wherein the electrically conductive metal or metal alloy that provides the second metallic structure is selected from the group consisting of copper (Cu), aluminum (Al), and a copper-aluminum (Cu—Al) alloy; and wherein a portion of the diffusion barrier liner, the metallic seed liner and the first metallic structure occupy a lower portion of the via portion of the combined via/line opening, and wherein another portion of the diffusion barrier liner and the second metallic structure occupy an upper portion of the via portion of the combined via/line opening and an entirety of the line portion of the combined via/line opening.

3. A semiconductor structure comprising:

an interconnect level comprising an interconnect dielectric material layer having a combined via/line opening located therein, wherein a via portion of the combined via/line opening is located directly beneath a line portion of the combined via/line opening;

a diffusion barrier liner located in both the via portion and the line portion of the combined via/line opening;

a metallic seed liner composed of an electrically conductive metal or metal alloy having a first bulk resistivity and located in both the via portion and the line portion of the combined via/line opening and directly contacting at least the diffusion barrier liner, wherein the electrically conductive metal or metal alloy that provides the metallic seed liner is selected from the group consisting of copper (Cu), aluminum (Al), and a copper-aluminum (Cu—Al) alloy;

a first metallic structure composed of an electrically conductive metal or metal alloy having a second bulk resistivity higher than the first bulk resistivity and located in the via portion and the line portion of the combined via/line opening, wherein the metallic seed liner is located directly on sidewall surfaces and a bottom wall of the first metallic structure and wherein a topmost surface of the first metallic structure is coplanar with a topmost surface of the metallic seed liner, and wherein the electrically conductive metal or metal alloy that provides the first metallic structure is selected from the group consisting of cobalt (Co), ruthenium (Ru), rhodium (Rh), iridium (Ir), nickel (Ni) and alloys thereof;

a second metallic structure composed of an electrically conductive metal or metal alloy that differs from the electrically conductive metal or metal alloy of the first metallic structure and located in the line portion of the combined via/line opening and located entirely above both the first metallic structure and the metallic seed liner, and wherein the electrically conductive metal or metal alloy that provides the second metallic structure is selected from the group consisting of copper (Cu), aluminum (Al), and a copper-aluminum (Cu—Al) alloy; and wherein topmost surfaces of the second metallic structure and the interconnect dielectric material layer are coplanar with each other, and wherein a topmost surface of the diffusion barrier liner is coplanar with the topmost surface of both the metallic seed liner and the first metallic structure.

* * * * *